United States Patent
Jung et al.

(10) Patent No.: US 12,125,515 B2
(45) Date of Patent: Oct. 22, 2024

(54) MEMORY DEVICE AND SEMICONDUCTOR DEVICE INCLUDING THE SAME

(71) Applicant: Samsung Electronics Co., Ltd., Suwon-si (KR)

(72) Inventors: Sang-Hoon Jung, Hwaseong-si (KR); Seong-Jin Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 308 days.

(21) Appl. No.: 17/682,257

(22) Filed: Feb. 28, 2022

(65) Prior Publication Data
US 2022/0406368 A1    Dec. 22, 2022

(30) Foreign Application Priority Data

Jun. 18, 2021    (KR) .................. 10-2021-0079186

(51) Int. Cl.
*G11C 11/406*    (2006.01)
*G11C 5/02*    (2006.01)
(Continued)

(52) U.S. Cl.
CPC ........ *G11C 11/40618* (2013.01); *G11C 5/025* (2013.01); *G11C 11/406* (2013.01);
(Continued)

(58) Field of Classification Search
CPC .......... G11C 11/40618; G11C 11/4072; G11C 11/4082; G11C 11/4085; G11C 5/025; G11C 17/143; G11C 17/16; G11C 11/408; G11C 11/4087; G11C 11/40622; G11C 11/406; G11C 11/401; G11C 11/40611; G11C 7/1045; G11C 8/12; G11C 11/40626; G11C 2211/4063; G11C 2211/4065

See application file for complete search history.

(56) References Cited

U.S. PATENT DOCUMENTS 9,570,142 B2    2/2017 Shido
9,753,667 B2    9/2017 Hebig et al.
(Continued)

FOREIGN PATENT DOCUMENTS

JP    2020-071589 A    5/2020
KR    10-2003-0038265 A    5/2003

*Primary Examiner* — Huan Hoang
*Assistant Examiner* — Justin Bryce Heisterkamp
(74) *Attorney, Agent, or Firm* — Harness, Dickey & Pierce, P.L.C.

(57) ABSTRACT

A memory device is provided. The memory device includes a plurality of memory chips that are stacked, wherein each of the memory chips includes a memory cell array, which includes a plurality of memory cell rows, a chip identifier generator configured to generate a chip identifier signal indicating a chip identifier of each of the memory chips, a refresh counter configured to generate a target row address for refreshing the memory cell rows in response to a refresh command, and a refresh row address generator, which receives the chip identifier signal and the target row address and outputs one of the target row address and an inverted target row address, obtained by inverting the target row address, as a refresh row address based on the chip identifier signal, and performs a refresh operation on a memory cell row corresponding to the refresh row address.

20 Claims, 20 Drawing Sheets

(51) Int. Cl.
G11C 11/4072 (2006.01)
G11C 11/408 (2006.01)

(52) U.S. Cl.
CPC ........ G11C 11/4072 (2013.01); G11C 11/408 (2013.01); G11C 11/4082 (2013.01); G11C 11/4085 (2013.01); G11C 11/4087 (2013.01); *G11C 11/40611* (2013.01)

(56) References Cited

U.S. PATENT DOCUMENTS

| | | | |
|---|---|---|---|
| 10,096,577 B2 | 10/2018 | Kim et al. | |
| 10,381,327 B2 | 8/2019 | Ramachandra et al. | |
| 10,425,260 B2 | 9/2019 | Hollis et al. | |
| 2014/0085999 A1* | 3/2014 | Kang | G11C 11/408 |
| | | | 365/222 |
| 2015/0043295 A1* | 2/2015 | Kim | G11C 11/406 |
| | | | 365/222 |
| 2015/0162068 A1* | 6/2015 | Woo | G11C 11/40615 |
| | | | 365/222 |
| 2016/0027492 A1* | 1/2016 | Byun | G11C 8/10 |
| | | | 365/222 |

* cited by examiner

MEMORY DEVICE AND SEMICONDUCTOR DEVICE INCLUDING THE SAME

CROSS-REFERENCE TO RELATED APPLICATION

This application claims priority to Korean Patent Application No. 10-2021-0079186, filed on Jun. 18, 2021, and all the benefits accruing therefrom under 35 U.S.C. § 119, the disclosure of which is incorporated herein by reference in its entirety.

BACKGROUND

1. Field

The present disclosure relates to a memory device and a semiconductor device including the same.

2. Description of the Related Art

A nonvolatile memory device such as a dynamic random access memory (DRAM) device may store data in cell capacitors. Data may be stored in the cell capacitors in the form of electric charge, and the electric charge stored in the cell capacitors may be lost over time. Thus, a refresh operation that senses/amplifies and rewrites data may be used before the electric charge stored in the cell capacitors is completely lost.

SUMMARY

Embodiments of the present disclosure provide a memory device capable of dispersing power noise and/or heat and thereby improving product reliability.

Embodiments of the present disclosure also provide a semiconductor device including a memory device capable of dispersing power noise and/or heat and thereby improving product reliability.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, a memory device includes a plurality of memory chips that are stacked, wherein each of the memory chips includes a memory cell array, which includes a plurality of memory cell rows; a chip identifier generator configured to generate a chip identifier signal indicating a chip identifier of each of the memory chips; a refresh counter configured to generate a target row address for refreshing a memory cell row from among the plurality of memory cell rows in response to a refresh command; and a refresh address generator configured to receive the chip identifier signal and the target row address, and output one of the target row address and an inverted target row address, obtained by inverting the target row address, as a refresh row address based on the chip identifier signal, and perform a refresh operation on a memory cell row corresponding to the refresh row address.

According to the aforementioned and other embodiments of the present disclosure, a memory device includes first and second memory chips, each of the first and second memory chips including a plurality of memory cell rows, wherein the first memory chip is configured to perform a refresh operation on a first memory cell row corresponding to a first refresh row address in response to a refresh command, and the second memory chip is configured to perform a refresh operation on a second memory cell row corresponding to a second refresh row address, which is different from the first refresh row address, in response to the refresh command while the first memory chip is performing a refresh operation on a first memory cell row.

According to the aforementioned and other embodiments of the present disclosure, a semiconductor device includes a memory controller providing a mode register set command and a refresh command; and a memory device including a plurality of memory chips that are stacked, each of the memory chips including a plurality of memory cell rows and a refresh counter are configured to generate a target row address for refreshing the memory cell rows in response to the refresh command, wherein the mode register set command includes a setting value for converting the target row address into a refresh row address by inverting or not inverting the target row address, during a refresh operation performed in response to the refresh command, and each of the memory chips is configured to store the setting value in a mode register in response to the mode register set command and perform a refresh operation on a memory cell row corresponding to one of the target row address and an inverted target row address, which is obtained by inverting the target row address based on the setting value, in response to the refresh command.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
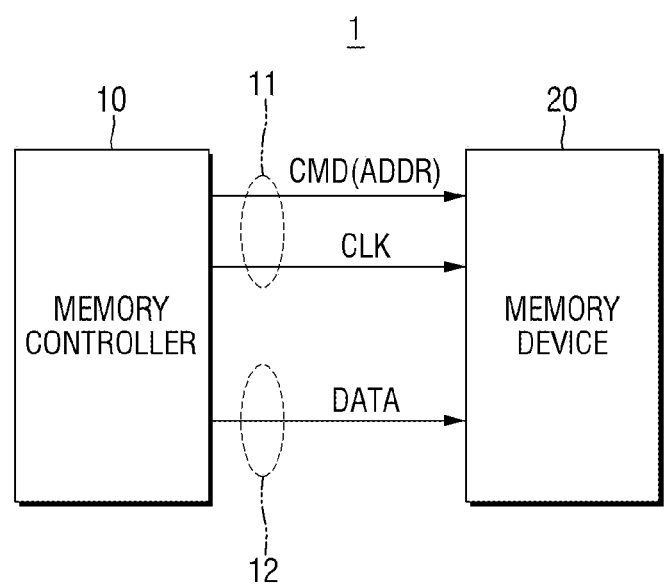
FIG. 1 is a block diagram of a semiconductor device according to some example embodiments of the present disclosure.

FIG. 1 is a block diagram of a semiconductor device according to some example embodiments of the present disclosure.

Referring to FIG. 1, a semiconductor device 1 may include a memory controller 10 and a memory device 20.

Each of the memory controller 10 and the memory device 20 may include an interface for communication between the memory controller 10 and the memory device 20. The interfaces of the memory controller 10 and the memory device 20 may be connected via a control bus 11, which is for transmitting a command CMD, an address ADDR, and a clock signal CLK, and a data bus 12, which is for transmitting data. The command CMD may be considered as including the address ADDR. The memory controller 10 may provide, for example, a refresh command or a command for setting the mode register of the memory device 20 to the memory device 20.

The memory controller 10 may generate (or be configured to generate) the command CMD, which is for controlling the memory device 20, and may write data "DATA" to, or read data "DATA" from, the memory device 20 under the control of the memory controller 10.

Figure 2:
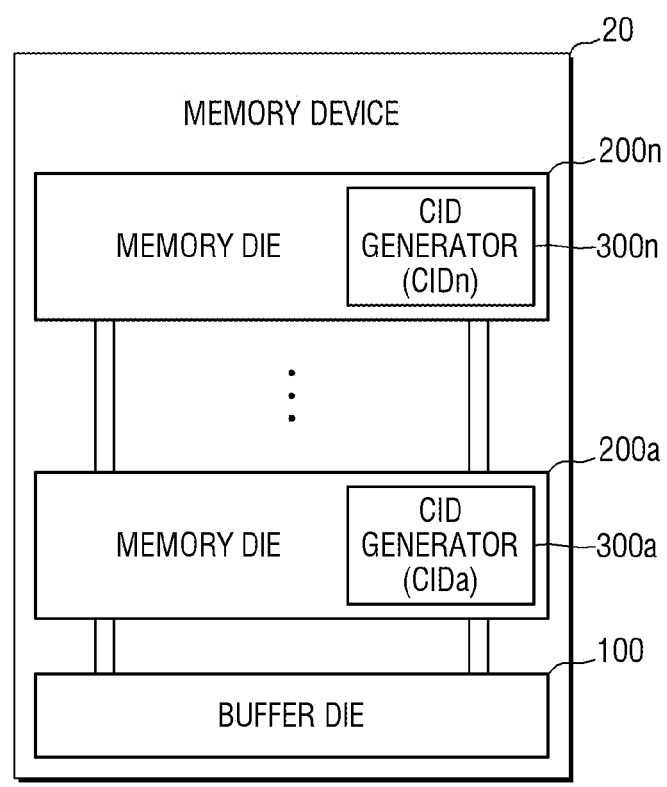
FIG. 2 is a block diagram of an example memory device of FIG. 1.
Figure 3:
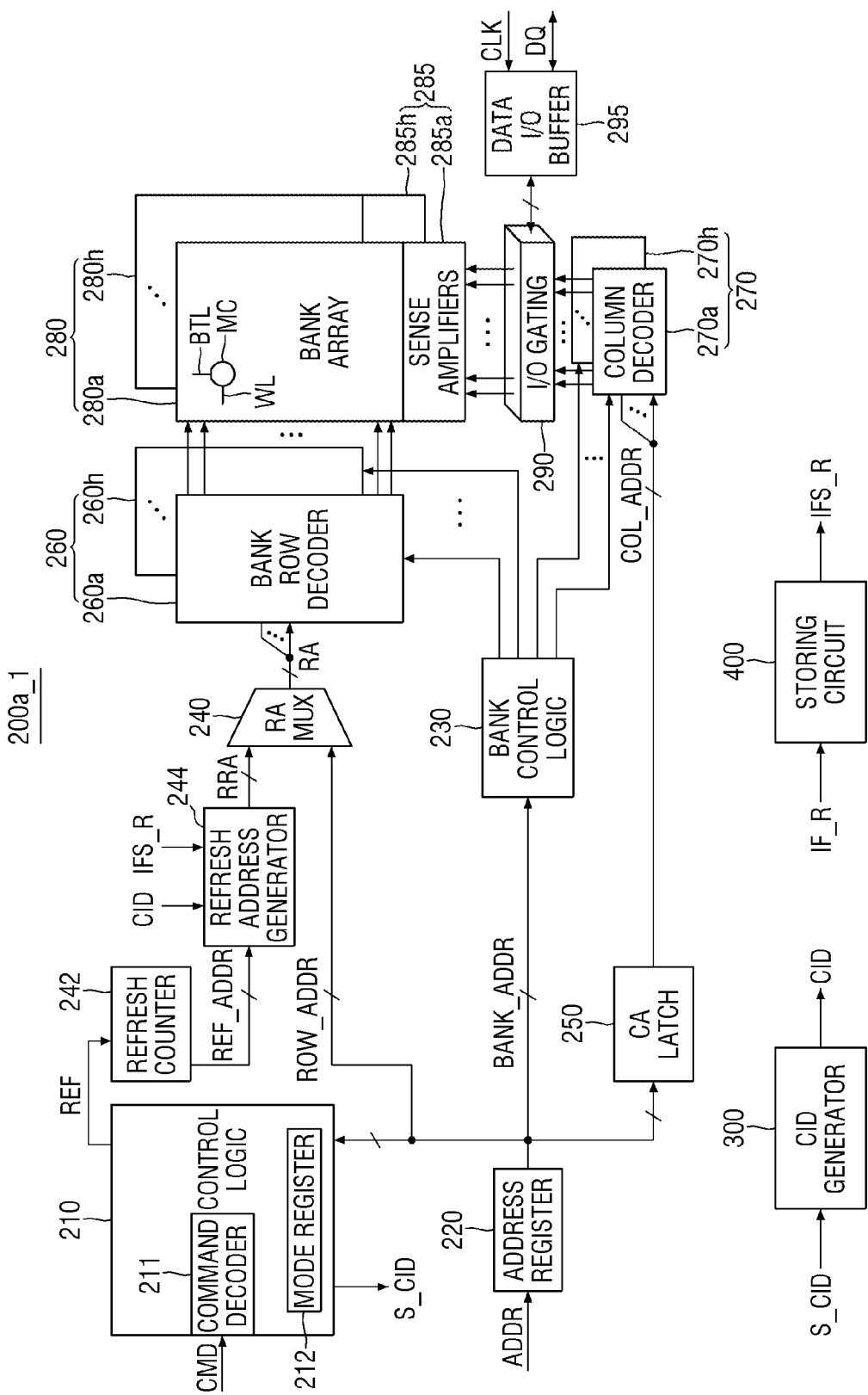
FIG. 3 is a block diagram of an example memory die of FIG. 2.

FIG. 2 is a block diagram of the memory device of FIG. 1. FIG. 3 is a block diagram of an example memory die of FIG. 2.

Referring to FIG. 2, the memory device 20 may be a stacked memory device including a buffer die 100 and a plurality of memory dies (200a through 200n where n is a natural number of 2 or greater). The memory device 20 may be a device in which the buffer die 100 and the memory dies (200a through 200n) are stacked and packaged. The memory dies (200a through 200n) may be stacked on the buffer die 100 and may be electrically connected to the buffer die 100. The memory dies (200a through 200n) and the buffer die 100 may be electrically connected via, for example, through silicon vias (TSVs). The memory dies (200a through 200n) may also be referred to as memory chips.

The buffer die 100 may communicate with the memory controller 10. Each of the memory dies (200a through 200n) may be a DRAM with multiple DRAM cells, such as a double data rate synchronous DRAM (DDR SDRAM), a low power double data rate (LPDDR) synchronous DRAM (SDRAM), a graphics double data rate (GDDR) SDRAM, or a Rambus DRAM (RDRAM).

The memory dies (200a through 200n) may include chip identifier (CID) generators (300a through 300n), respectively. The CID generators (300a through 300n) may generate (or be configured to generate) the CIDs of the memory dies (200a through 200n), i.e., first through n-th CIDs "CID1" through "CIDn".

Referring to FIG. 3, a CID generation signal S_CID may be an M-bit signal (where M is a natural number), and the CID generators (300a through 300n) may include adders.

The first CID generator 300a may generate (or be configured to generate) the first CID "CID1" by adding a binary one to the CID generation signal S_CID, which is M-bit long, and the n-th CID generator 300n may generate (or be configured to generate) the n-th CID "CIDn" by adding a binary one to the (n−1)-th CID "CIDn-1". Alternatively, the CID generators (300a through 300n) may include fuse circuits, which store the first through n-th CIDs "CID1" through "CIDn". The first CID generator 300a may store (or be configured to store) the first CID "CID1", and the n-th CID generator 300n may store (or be configured to store) the n-th CID "CIDn".

Referring to FIG. 3, a memory die 200a_1 may include a control logic 210, an address register 220, a bank control logic 230, a row address multiplexer 240, a refresh counter 242, a refresh address generator 244, a column address latch 250, a bank row decoder 260, a column decoder 270, a memory cell array 280, a sense amplifier unit 285, an input/output gating circuit 290, a data input/output buffer 295, a CID generator 300, and a storing circuit 400.

The memory dies (200a through 200n) may be substantially identical to the memory die 200a_1.

The memory cell array 280 may include a plurality of memory bank arrays (280a through 280h). FIG. 3 illustrates that the memory cell array 280 includes eight memory bank arrays, but the present disclosure is not limited thereto. That is, the memory die 200a_1 may include an arbitrary number of memory bank arrays.

Each of the memory bank arrays (280a through 280h) may include a plurality of wordlines WL, a plurality of bitlines BTL, and a plurality of memory cells MC, which are formed at the intersections between the wordlines WL and the bitlines BTL.

The bank row decoder 260 may include a plurality of bank row decoders (260a through 260h), which are connected to the memory bank arrays (280a through 280h), respectively, the column decoder 270 may include a plurality of column decoders (270a through 270h), which are connected to the memory bank arrays (280a through 280h), respectively, and the sense amplifier unit 285 may include a plurality of sense amplifiers (285a through 285h), which are connected to the memory bank arrays (280a through 280h), respectively.

The address register 220 may receive (or be configured to receive) an address ADDR, which includes a bank address BANK_ADDR, a row address ROW_ADDR, and a column address COL_ADDR, from the memory controller 10. The address register 220 may provide the bank address BANK_ADDR to the bank control logic 230, the row address ROW_ADDR to the row address multiplexer 240, and the column address COL_ADDR to the column address latch 250.

The bank control logic 230 may generate (or be configured to generate) bank control signals in response to the bank address BANK_ADDR. One of the bank row decoders (260a through 260h) corresponding to the bank address BANK_ADDR and one of the bank column decoders (270a through 270h) corresponding to the bank address BANK_ADDR may be activated in response to the bank control signals.

The refresh counter 242 may sequentially output target row addresses REF_ADDR in accordance with (or based on) a control signal REF from the control logic 210. In response to a refresh command being received from the memory controller 10, the control logic 210 may generate (or be configured to generate) the control signal REF and may provide the control signal REF to the refresh counter 242. The refresh command may be an all-bank refresh command giving instructions to refresh all the bank arrays 280a through 280h. Alternatively, the refresh command may be a per-bank refresh command giving instructions to refresh each of the bank arrays 280a through 280h.

The refresh address generator 244 may receive (or be configured to receive) the target row addresses REF_ADDR, the CIDs, and setting values IFS_R for the target row addresses REF_ADDR for each of the CIDs. The refresh address generator 244 may output (or be configured to output) either the target row addresses REF_ADDR or inverted target row addresses, which are obtained by inverting the target row addresses REF_ADDR, as refresh row addresses RRA based on the CIDs and the setting values IFS_R for the target row addresses REF_ADDR for each of the CIDs. That is, in response to the memory device 20 receiving a refresh command from the memory controller 10, the refresh address generator 244 may output (or be configured to output) either the target row addresses REF_ADDR or the inverted target row addresses as the refresh row addresses RRA.

The storing circuit 400 may store (or be configured to store) the setting values IFS_R for target row addresses REF_ADDR for each of the CIDs based on setting information IF_R. The storing circuit 400 will be described later with reference to FIGS. 7 and 8.

The row address multiplexer 240 may receive (or be configured to receive) a row address ROW_ADDR from the address register 220 and may receive (or be configured to receive) a refresh row address RRA from the refresh address generator 244. The row address multiplexer 240 may selectively output (or be configured to selectively output) the row address ROW_ADDR or the refresh row address RRA as a row address RA. Then, the row address RA may be applied to each of the bank row decoders (260a through 260h).

The bank row decoder activated by the bank control logic 230 may decode the row address RA, which is output from the row address multiplexer 240, and may activate a wordline WL corresponding to the decoded row address. For example, the bank row decoder activated by the bank control logic 230 may apply a wordline driving voltage to the wordline corresponding to the decoded row address.

The column address latch 250 may receive (or be configured to receive) the column address COL_ADDR from the address register 220 and may temporarily store the column address COL_ADDR. The column address latch 250 may incrementally raise the column address COL_ADDR in a burst mode. The column address latch 250 may apply the temporarily-stored column address or the incrementally-raised column address to each of the column decoders (270a through 270h).

The bank row decoder activated by the bank control logic 230 may activate a sense amplifier corresponding to the bank address BANK_ADDR and the column address COL_ADDR via the input/output gating circuit 290.

The input/output gating circuit 290 may include circuits for gating input/output data, an input data mask logic, read data latches for storing data output from the bank arrays (280a through 280h), and write drivers for writing data to the bank arrays (280a through 280h).

Data DQ read from one of the bank arrays (280a through 280h) may be sensed by one of the sense amplifiers (285a through 285h) corresponding to the bank array from which the data DQ has been read, and may be stored in the read data latches. Then, the data DQ may be provided to the memory controller 10 via the data input/output buffer 295.

Data DQ to be written to one of the bank arrays (280a through 280h) may be provided to the input/output gating circuit 290, and the input/output gating circuit 290 may write the data DQ to one of the bank arrays (280a through 280h) corresponding to the bank array to which the data DQ is to be written, via the write drivers.

The control logic 210 may control the operation of the memory die 200a_1. For example, the control logic 210 may generate (or be configured to generate) control signals such that the memory die 200a_1 may perform (or be configured to perform) a write operation or a read operation. The control logic 210 may include a command decoder 211, which decodes the command CMD, received from the memory controller 10, and a mode register 212, which is for setting the operating mode of the memory die 200a_1 based on a mode register set MRS.

Figure 4:
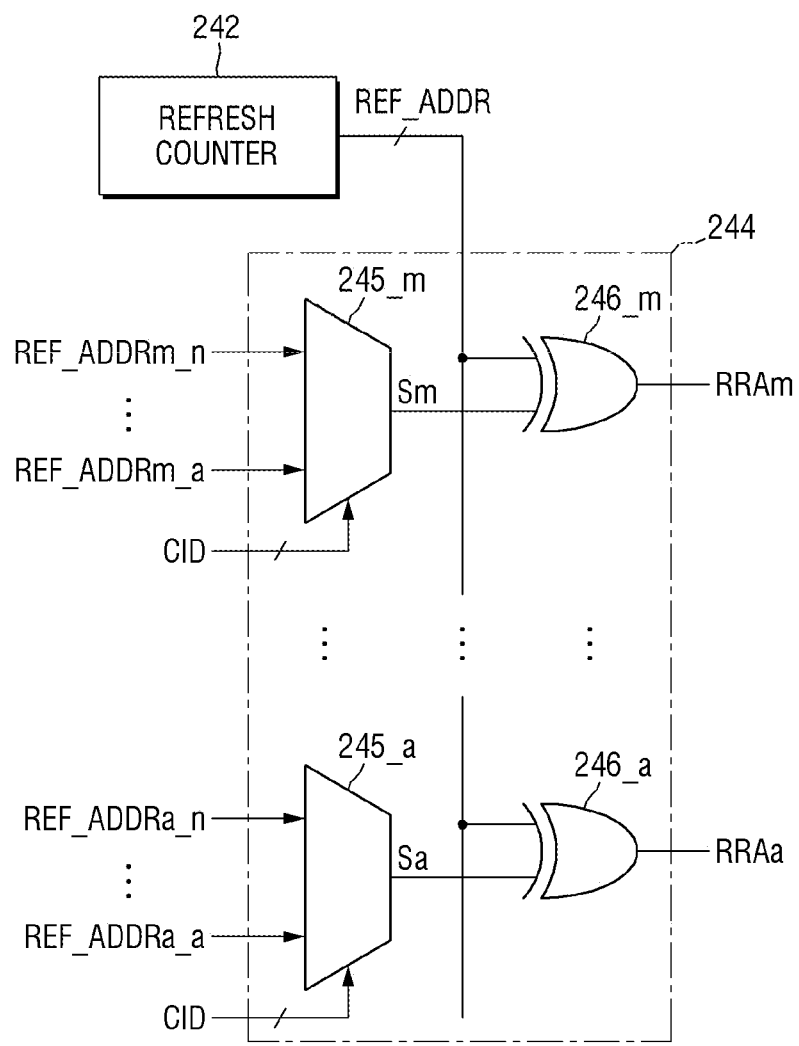
FIG. 4 is a block diagram of an example refresh address generator of FIG. 3.

FIG. 4 is a block diagram of an example refresh address generator of FIG. 3.

Referring to FIGS. 3 and 4, setting values IFS_R may include first through m-th sets of setting values (REF_ADDRa_a through REF_ADDRa_n)~(REF_ADDRm_a through REF_ADDRm_n)) for first through m-th target row addresses REF_ADDRa through REF_ADDRm that correspond to first through m-th memory cell rows (or first through m-th wordlines) of each of the memory dies (200a through 200n). For example, a setting value REF_ADDRa_a may be a setting value for a first target row address REF_ADDRa that corresponds to a first memory cell row of the first memory die 200a, and a setting value REF_ADDRm_n may be a setting value for an m-th target row address REF_ADDRm that corresponds to an m-th memory cell row of the n-th memory die 200n. That is, the setting values IFS_R may be set for each of the memory dies (200a through 200n), i.e., for each of the CIDs.

The refresh address generator 244 may include a plurality of multiplexers (245_a through 245_m) and a plurality of inverters (246_a through 246_m). For example, the numbers of multiplexers (245_a through 245_m) and a plurality of inverters (246_a through 246_m) may be identical to, for example, the number of memory cell rows included in each of the memory dies (200a through 200n). For example, the inverters 246_a through 246_m may be depicted as exclusive-OR gates which serve as "programmable inverters".

Each of the multiplexers (245_a through 245_m) may select one of the setting values IFS_R for each of the CIDs and may output (or be configured to output) the selected setting value as one of a plurality of intermediate signals (Sa through Sm). One of the multiplexers (245_a through 245_m) may receive (or be configured to receive) a setting value IFS_R set for each of the CIDs for one particular target row address and may output (or be configured to output) the received setting value for the particular target row address.

For example, an m-th multiplexer 245_m may select (or be configured to select) one of setting values REF_ADDRm_a through REF_ADDRm_n for an m-th target row address REF_ADDRm corresponding to the m-th memory cell rows of the memory dies (200a through 200n) and may output (or be configured to output) the selected setting value as an m-th intermediate signal Sm. The m-th multiplexer 245_m may output (or be configured to output), as the m-th intermediate signal Sm, the setting value REF_ADDRm_n for the m-th target row address REF_ADDR corresponding to the m-th memory cell row of the n-th memory die 200n based on the n-th CID "CIDn".

The inverters (246_a through 246_m) may output (or be configured to output) either the target row addresses REF_ADDR or the inverted target row addresses as refresh row addresses (RRAa through RRAm) in accordance with (or based on) the intermediate signals (Sa through Sm). For example, the inverters (246_a through 246_m) may perform (or be configured to perform) an XOR operation on the intermediate signals (Sa through Sm) and the target row addresses REF_ADDR.

For example, if the intermediate signals (Sa through Sm) are logic high, the inverted target row addresses may be output as the refresh row addresses (RRAa through RRAm), and if the intermediate signals (Sa through Sm) are logic low, the target row addresses REF_ADDR may be output as the refresh row addresses (RRAa through RRAm). In other words, if the setting values IFS_R are logic high, the inverted target row addresses may be output as the refresh row addresses (RRAa through RRAm), and if the setting values IFS_R are logic low, the target row addresses REF_ADDR may be output as the refresh row addresses (RRAa through RRAm). That is, the setting values IFS_R may be values for determining whether to invert the target row addresses REF_ADDR.

Figure 5:
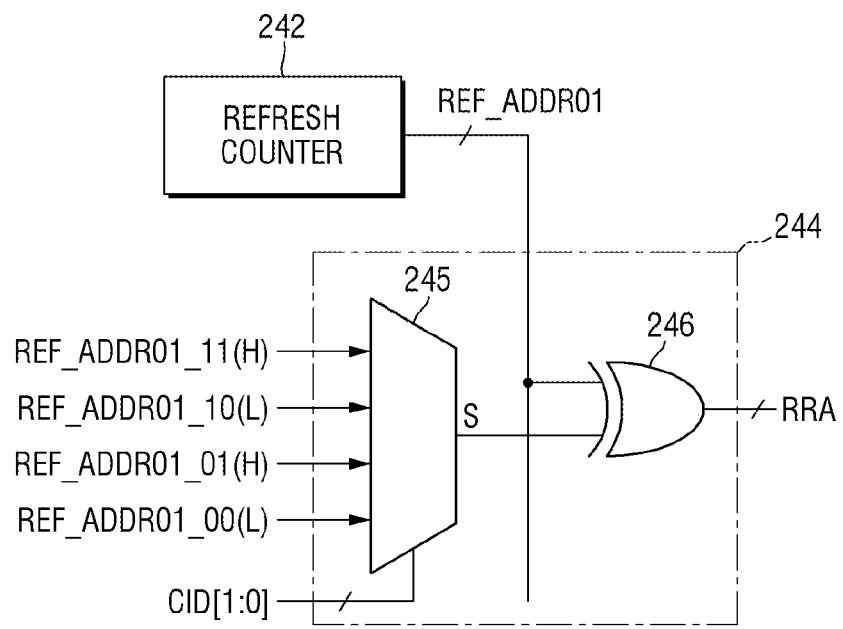
FIGS. 5 and 6 are block diagrams for explaining the operation of a memory device according to some example embodiments of the present disclosure.
Figure 6:
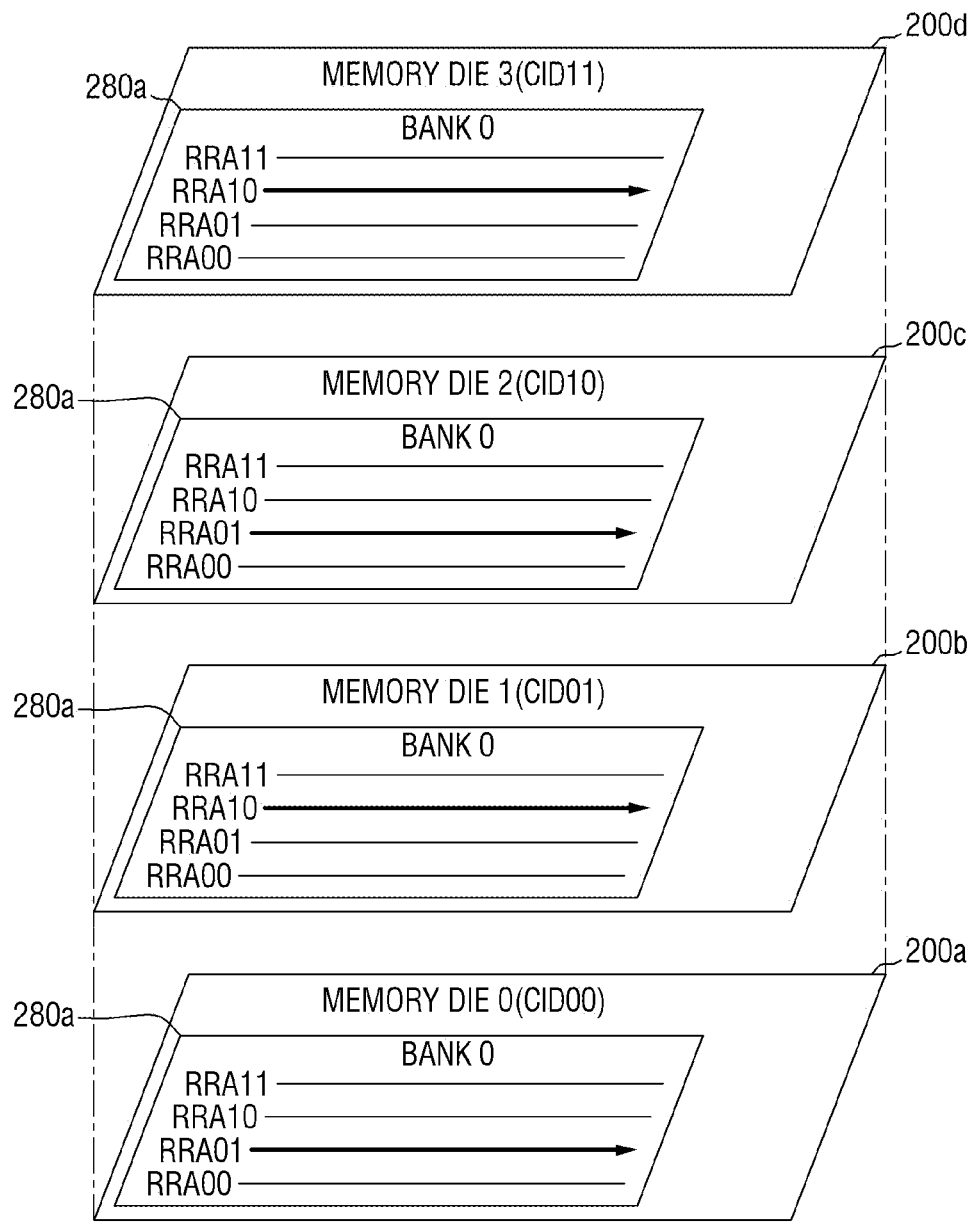

FIGS. 5 and 6 are block diagrams for explaining the operation of a memory device according to some example embodiments of the present disclosure.

Referring to FIGS. 5 and 6, a memory device 20 may include first through fourth memory dies 200a through 200d. The first through fourth memory dies 200a through 200d may have first through fourth CIDs "CID00", "CID01", "CID10", and "CID11", respectively.

It is assumed that the first through fourth memory dies 200a through 200d are performing a refresh operation on their first bank arrays 280a in response to the receipt of a refresh command, and that a refresh counter 242 outputs a second target row address REF_ADDR01 corresponding to second memory cell rows of the first through fourth memory dies 200a through 200d.

A multiplexer 245 may output (or be configured to output) one of setting values REF_ADDR01_00 through REF_ADDR01_11 for the second target row address REF_ADDR01 as an intermediate signal S based on each CID "CID[1:0]".

An inverter 246 may output (or be configured to output) a refresh row address RRA by performing an XOR operation on the second target row address REF_ADDR01 and the intermediate signal S output from the refresh counter 242.

For example, a setting value REF_ADDR01_00 for the first CID "CID00" and a setting value REF_ADDR01_10 for the third CID "CID10" may be logic low, and a setting value REF_ADDR01_01 for the second CID "CID01" and a setting value REF_ADDR01_11 for the fourth CID "CID11" may be logic high. That is, the second target row address REF_ADDR01, which corresponds to the second memory cell rows of the first through fourth memory dies 200a through 200d, may be set to be inverted for the second memory cell rows of the second and fourth memory dies 200b and 200d. Thus, the first and third memory dies 200a and 200c may receive (or be configured to receive) the second target row address REF_ADDR01 as a refresh row address RRA01, and the second and fourth memory dies 200b and 200d may receive (or be configured to receive) an inverted second target row address, which is obtained by inverting the second target row address REF_ADDR01, as a refresh row address RRA10. That is, the first and third memory dies 200a and 200c may receive (or be configured to receive) a different refresh row address from the second and fourth memory dies 200b and 200d.

The first and third memory dies 200a and 200c may perform (or be configured to perform) a refresh operation on their memory cell rows corresponding to a refresh row address RRA01, and the second and fourth memory dies 200b and 200d may perform (or be configured to perform) a refresh operation on their memory cell rows corresponding to a refresh row address RRA10. Accordingly, a memory cell row of the first memory die 200a where a refresh operation is performed may not overlap with a memory cell row of the second memory die 200b where a refresh operation is performed, and a memory cell row of the third memory die 200c where a refresh operation is performed may not overlap with a memory cell row of the fourth memory die 200d where a refresh operation is performed. That is, memory cell rows of a pair of adjacent memory dies where a refresh operation is performed may not overlap with each other. Here, the term "a pair of adjacent memory dies" means two memory dies with no intervening memory die therebetween.

For example, a memory cell row corresponding to the refresh row address RRA01 of a first memory die 200a may be a k-th memory cell row from an uppermost memory cell row in the first bank array 280a (e.g., a memory cell row corresponding to a refresh row address RRA11), and a memory cell row corresponding to the refresh row address RRA10 of a second memory die 200b may be a k-th memory cell row from a lowermost memory cell row in the first bank array 280a (e.g., a memory cell row corresponding to a refresh row address RRA00). The memory cell row corresponding to the refresh row address RRA01 of the first memory die 200a may be a second memory cell row from the uppermost memory cell row in the first bank array 280a, and the memory cell row corresponding to the refresh row address RRA10 of the second memory die 200b may be a second memory cell row from the lowermost memory cell row in the first bank array 280a. The memory cell row corresponding to the refresh row address RRA01 of the first memory die 200a and the memory cell row corresponding to the refresh row address RRA10 of the second memory die 200b may not overlap with each other with respect to a central line of the first bank array 280a that extends in parallel to the memory cell rows in the first bank array 280a.

For example, the memory cell row corresponding to the refresh row address RRA01 of the first memory die 200a may overlap with the memory cell row corresponding to the refresh row address RRA01 of a third memory die 200c, and the memory cell row corresponding to the refresh row address RRA10 of the second memory die 200b may overlap with the memory cell row corresponding to the refresh row address RRA10 of a fourth memory die 200d.

A memory device where multiple memory dies are stacked may be susceptible to power noise or heat. Particularly, when the memory device performs a refresh operation, the same memory cell row in the same memory bank array in each of the memory dies may be refreshed so that a considerable amount of power noise and heat may be generated.

On the contrary, the memory device 20 can control each of the counting row addresses of the first through fourth memory dies 200a through 200d. The memory device 20 may determine whether to invert each of the counting row addresses of the first through fourth memory dies 200a through 200d and may generate (or be configured to generate) refresh row addresses by inverting or not inverting the counting row addresses of the first through fourth memory dies 200a through 200d. The memory device 20 can generate (or be configured to generate) refresh bank addresses for the counting row addresses of the memory dies 200a through 200d such that power noise and heat therefrom can be distributed. Particularly, memory cell rows corresponding to the same refresh row address provided to a pair of adjacent memory dies may be configured not to overlap with each other. Accordingly, even if the first through fourth memory dies 200a through 200d are stacked, power noise and heat can be properly distributed.

Figure 7:
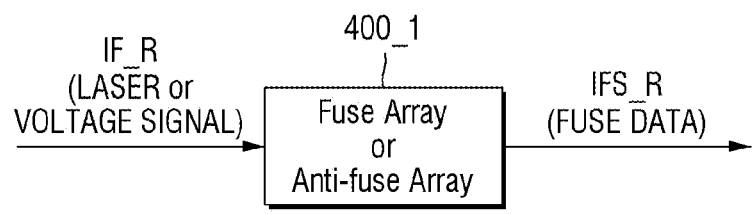
FIGS. 7 and 8 are block diagrams of example storing circuits of FIG. 3.
Figure 8:
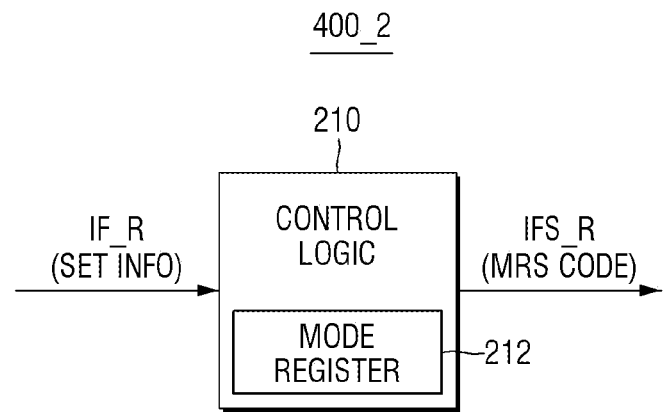

FIGS. 7 and 8 are block diagrams of example storing circuits of FIG. 3.

Referring to FIG. 7, a storing circuit 400_1 may be implemented as a fuse array or an anti-fuse array. The fuse array or the anti-fuse array may include an array of a plurality of fuses or an array of a plurality of anti-fuses.

For example, in a case where the fuses or the anti-fuses are programmed by external laser equipment, setting values IFS_R may be stored in a nonvolatile manner by the fuses or the anti-fuses.

In another example, in a case where the fuses or the anti-fuses are programmed by an electric signal (e.g., a high-voltage signal), the setting values IFS_R may be stored in a volatile manner by input from the manufacturer of the memory device 20 or may be stored in a nonvolatile manner by input from a user after the release of the memory device 20.

Referring to FIG. 8, a storing circuit 400_2 may be implemented as a mode register 212. Setting values IFS_R may be stored in the mode register 212 in accordance with (or based on) setting information IF_R input from the user. During an initial operation of the memory device 20, the setting values IFS_R may be provided to a refresh address generator 244 as mode register set (MRS) codes. Alternatively, in response to the receipt of a command for setting the mode register 212 from the memory controller 10, the setting values IFS_R may be stored in the mode register 212. For example, the setting values IFS_R may be stored in the mode register 212 in response to the receipt of a Double Data Rate 4 (DDR4) MRS command or a Double Data Rate 5 (DDR5) mode register write (MRW) command.

Figure 9:
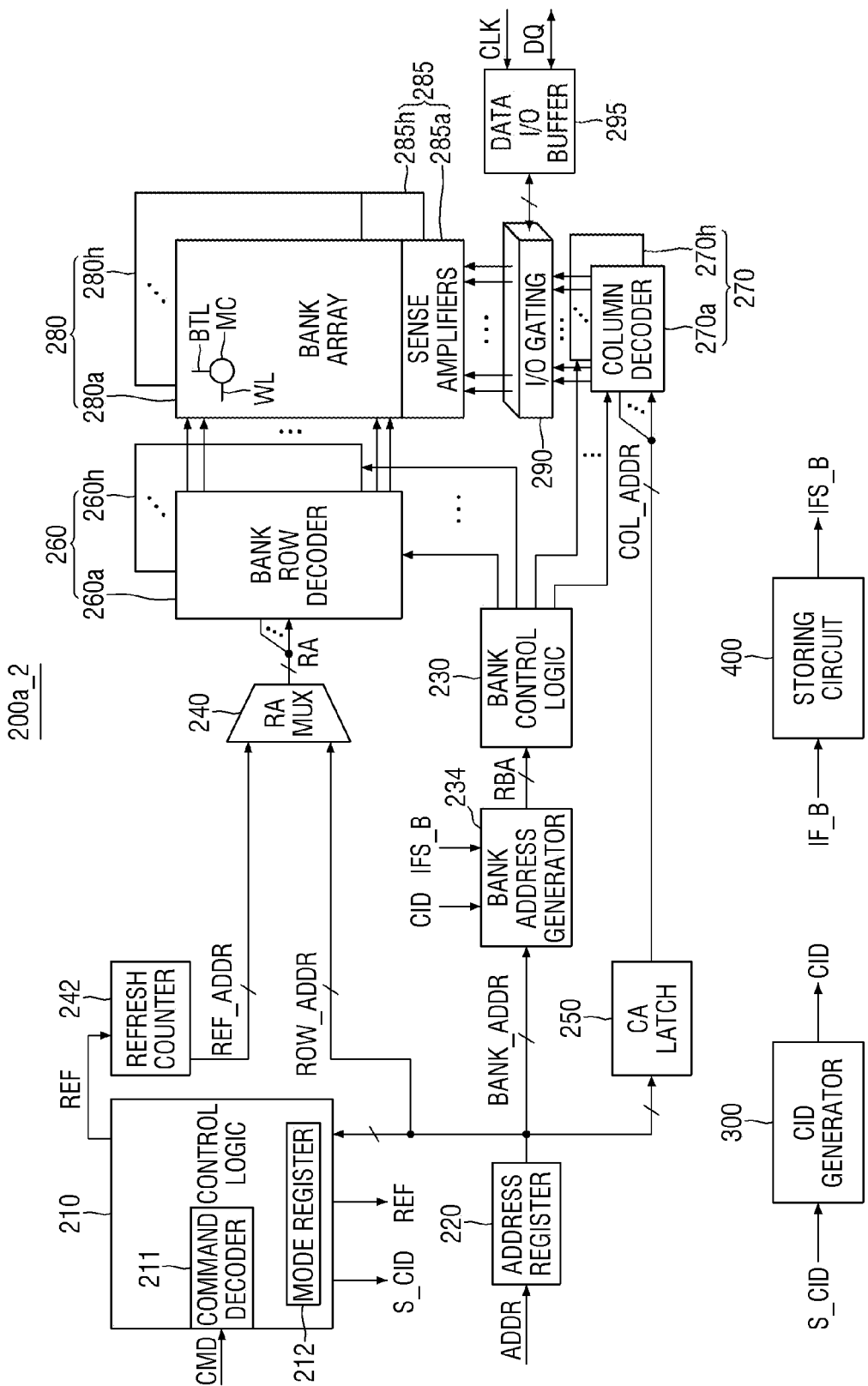
FIG. 9 is a block diagram of another example memory die of FIG. 1.
Figure 10:
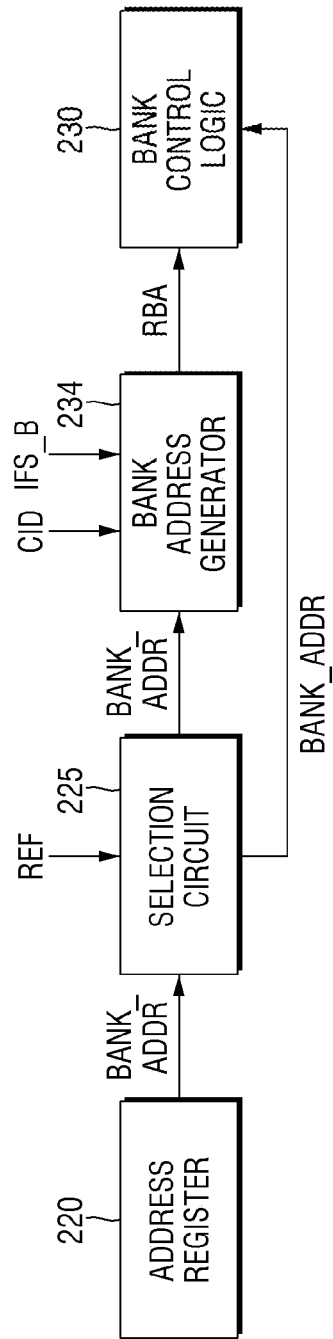
FIG. 10 is a block diagram of an example bank address generator of FIG. 9.

FIG. 9 is a block diagram of another example memory die of FIG. 1. FIG. 10 is a block diagram of an example bank address generator of FIG. 9. For convenience, the memory die of FIG. 9 will hereinafter be described, focusing mainly on the memory die of FIG. 2.

Referring to a memory die 200a_2 of FIG. 9, a refresh counter 242 may sequentially output target row addresses REF_ADDR in accordance with (or based on) a control signal from a control logic 210, and a row address multiplexer 240 may receive (or be configured to receive) the target row addresses REF_ADDR from the refresh counter 242. The row address multiplexer 240 may selectively output (or be configured to selectively output) a row address ROW_ADDR or a target row address REF_ADDR as a row address RA.

The memory die 200a_2 may further include a bank address generator 234. The bank address generator 234 may receive (or be configured to receive) bank addresses BANK_ADDR, the CIDs, and setting values IFS_B for the bank address BANK_ADDR for each of the CIDs. The bank address generator 234 may output (or be configured to output) either the bank addresses BANK_ADDR or inverted bank addresses, which are obtained by inverting the bank addresses BANK_ADDR, as refresh bank addresses RBA based on the CIDs and the setting values IFS_B for the bank addresses BANK_ADDR for each of the CIDs. A bank control logic 230 may generate (or be configured to generate) bank control signals in response to the refresh bank addresses RBA.

Referring to FIGS. 9 and 10, a selection circuit 225 may be disposed between the address register 220 and the bank address generator 234. The selection circuit 225 may receive (or be configured to receive) a bank address BANK_ADDR from the address register 220 and may provide the bank address BANK_ADDR to one of the bank address generator 234 and the bank control logic 230 in accordance with (or based on) a control signal REF.

In response to a refresh command being received from the memory controller 10, the control logic 210 may generate (or be configured to generate) the control signal REF and may provide the control signal REF to the selection circuit 225. The refresh command may be, for example, a per-bank refresh command giving instructions to refresh each of a plurality of bank arrays (280a through 280h). The selection circuit 225 may provide the bank address BANK_ADDR to the bank address generator 234 if the control signal REF is received, and may provide the bank address BANK_ADDR to the bank control logic 230 if the control signal REF is not received.

Alternatively, the selection circuit 225 may be disposed between the bank address generator 234 and the bank control logic 230. The selection circuit 225 may provide a refresh bank address RBA to the bank control logic 230 if the control signal REF is received, and may provide the bank address BANK_ADDR to the bank control logic 230 if the control signal REF is not received.

A storing circuit 400 may store (or be configured to store) the setting values IFS_B for the bank addresses BANK_ADDR for each of the CIDs. The storing circuit 400 will be described later with reference to FIGS. 16 and 17.

Figure 11:
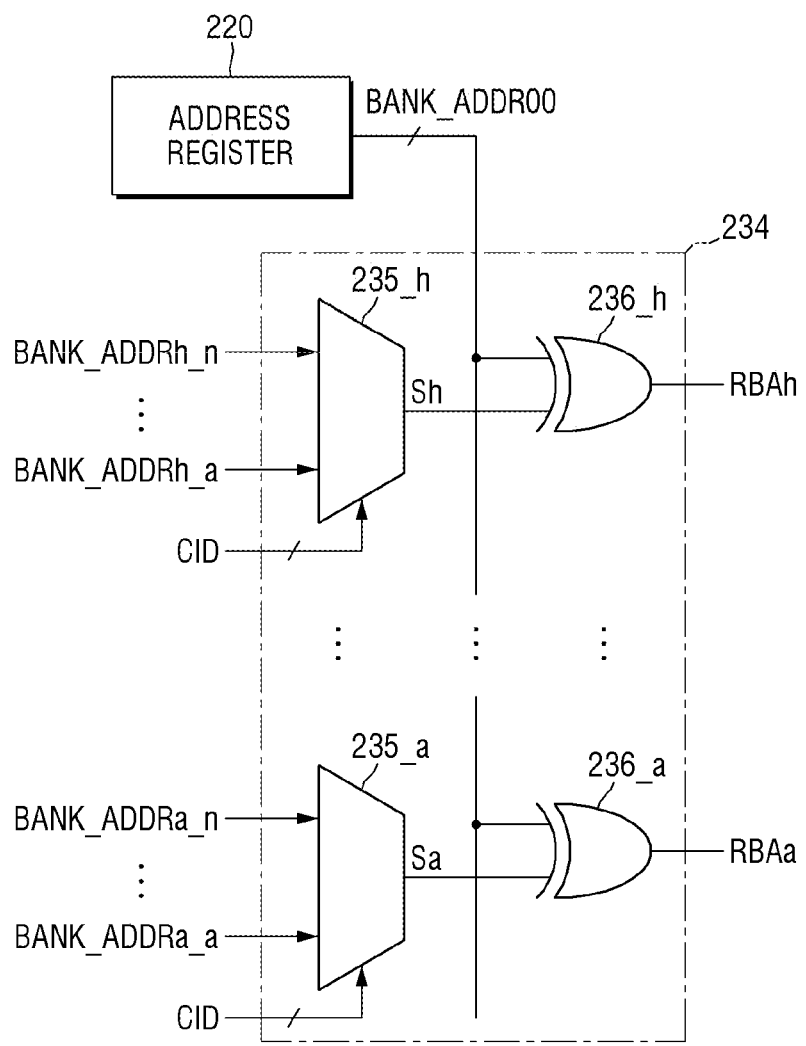
FIG. 11 is a block diagram of another example bank address generator of FIG. 9.

FIG. 11 is a block diagram of another example bank address generator of FIG. 9.

Referring to FIGS. 9 and 11, setting values IFS_B may include first through h-th sets of setting values (BANK_ADDRa_a through BANK_ADDRa_n)~(BANK_ADDRh_a through BANK_ADDRh_n)) for first through h-th bank addresses BANK_ADDRa through BANK_ADDRh that correspond to first through h-th bank arrays 280a through 280h of each of the memory dies (200a through 200n). For example, a setting value BANK_ADDRa_a may be a setting value for a first bank address BANK_ADDRa corresponding to the first bank array 280a of the first memory die 200a, and a setting value BANK_ADDRh_n may be a setting value for an h-th bank address BANK_ADDRh corresponding to an h-th bank array 280h of the n-th memory die 200n. That is, the setting values IFS_B may be set for each of the memory dies (200a through 200n), i.e., for each of the CIDs.

The bank address generator 234 may include a plurality of multiplexers (235_a through 235_h) and a plurality of inverters (236_a through 236_h). The numbers of multiplexers (235_a through 235_h) and a plurality of inverters (236_a through 236_h) may be identical to, for example, the number of bank arrays (280a through 280h) included in each of the memory dies (200a through 200n).

Each of the multiplexers (235_a through 235_h) may select (or be configured to select) one of the setting values IFS_B for each of the CIDs and may output (or be configured to output) the selected setting value as one of a plurality of intermediate signals (Sa through Sh). One of the multiplexers (235_a through 235_h) may receive (or be configured to receive) a setting value IFS_B set for each of the CIDs for one bank address and may output (or be configured to output) the received setting value for the particular bank address.

For example, an h-th multiplexer 235_h may select (or be configured to select) one of setting values BANK_ADDRh_a through BANK_ADDRh_n for the h-th bank array 280h of the memory dies (200a through 200n) and may output (or be configured to output) the selected setting value as an h-th intermediate signal Sh. The h-th multiplexer 235_h may output (or be configured to output), as the h-th intermediate signal Sh, the setting value BANK_ADDRh_n for the h-th bank address BANK_ADDRh corresponding to the h-th bank array 280h of the n-th memory die 200n based on the n-th CID "CIDn".

The inverters (236_a through 236_h) may output (or be configured to output) either the bank addresses BANK_ADDR or the inverted bank addresses as refresh bank addresses (RBAa through RBAh) in accordance with (or based on) the intermediate signals (Sa through Sh). For example, the inverters (236_a through 236_h) may perform (or be configured to perform) an XOR operation on the intermediate signals (Sa through Sh) and the bank addresses BANK_ADDR.

For example, if the intermediate signals (Sa through Sh) are logic high, the inverted bank addresses may be output as the refresh bank addresses (RBAa through RBAh), and if the intermediate signals (Sa through Sh) are logic low, the bank addresses BANK_ADDR may be output as the refresh bank addresses (RBAa through RBAh). In other words, if the setting values IFS_B are logic high, the inverted bank addresses may be output as the refresh row addresses (RRAa through RRAm), and if the setting values IFS_B are logic low, the bank addresses BANK_ADDR may be output as the refresh bank addresses (RBAa through RBAh). That is, the setting values IFS_B may be values for determining whether to invert the bank addresses BANK_ADDR.

Figure 12:
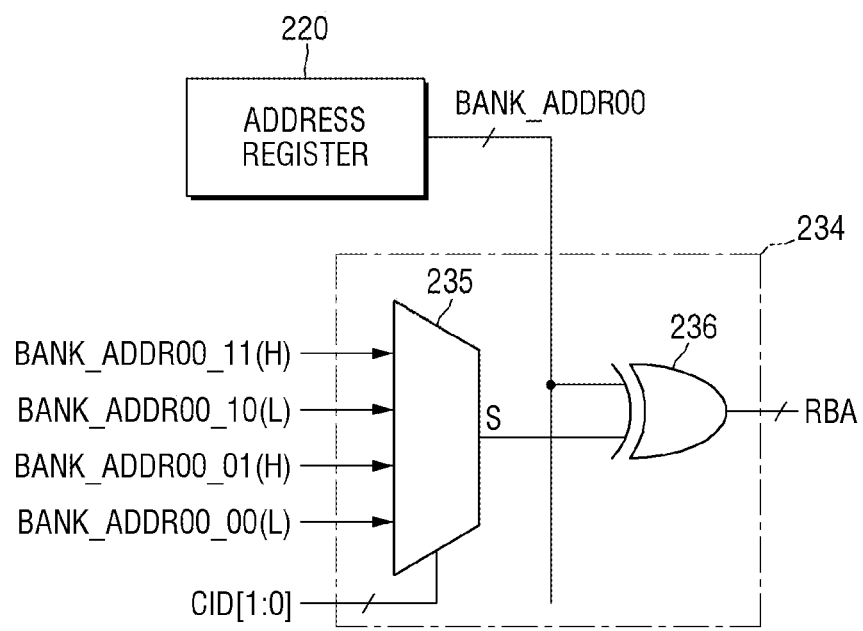
FIGS. 12 and 13 are block diagrams for explaining the operation of a memory device according to some example embodiments of the present disclosure.
Figure 13:
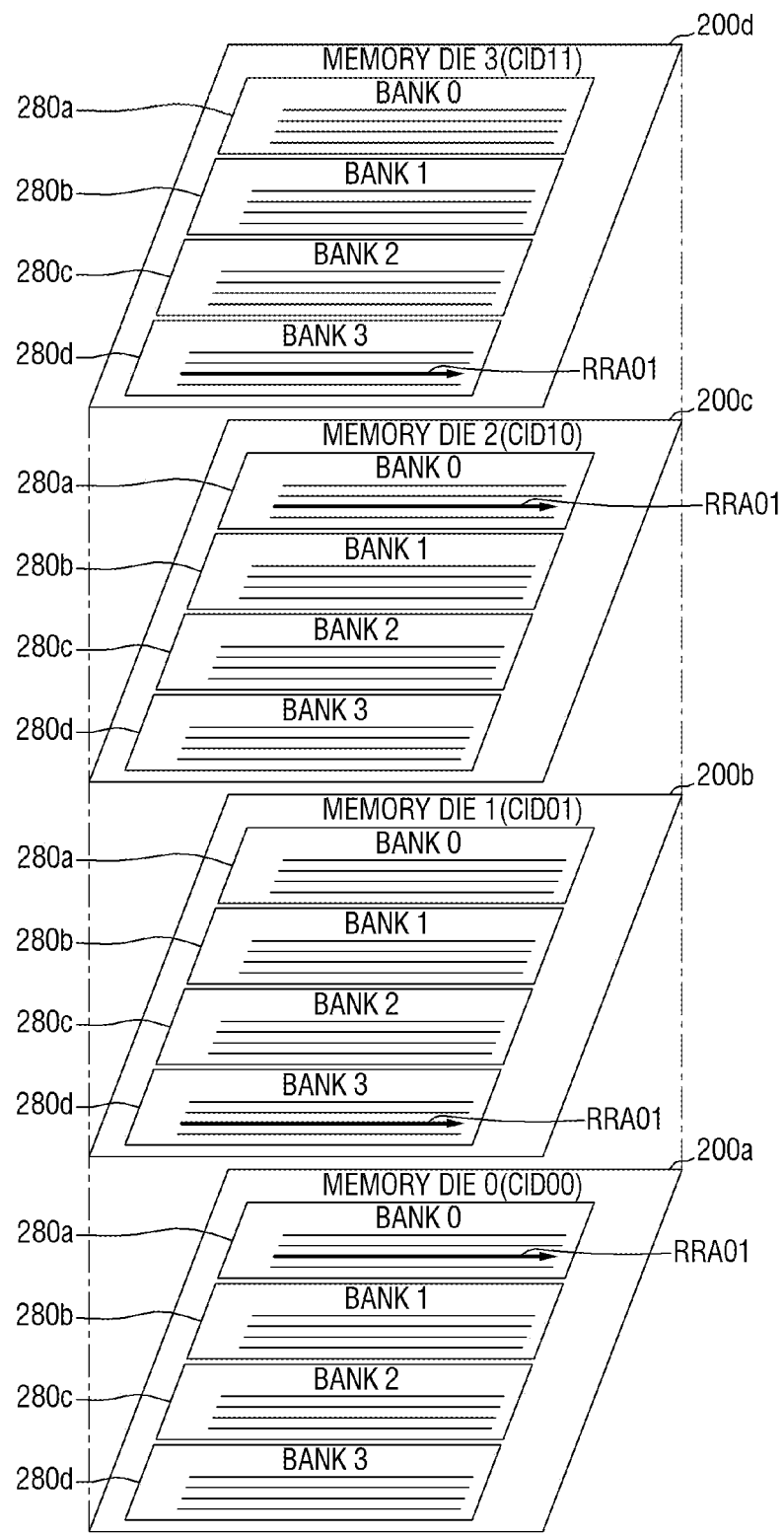

FIGS. 12 and 13 are block diagrams for explaining the operation of a memory device according to some example embodiments of the present disclosure.

Referring to FIGS. 12 and 13, a memory device 20 may include first through fourth memory dies 200a through 200d. The first through fourth memory dies 200a through 200d may have first through fourth CIDs "CID00", "CID01", "CID10", and "CID11", respectively. Each of the first through fourth memory dies 200a through 200d may include first through fourth bank arrays 280a through 280d. First through fourth bank addresses BANK_ADDR00 through BANK_ADDR11 may correspond to the first through fourth bank arrays 280a through 280d, respectively.

It is assumed that the first through fourth memory dies 200a through 200d receive a refresh command, and that an address register 220 outputs the first bank address BANK_ADDR00.

A multiplexer 235 may output (or be configured to output) one of setting values BANK_ADDR00_00 through BANK_ADDR00_11 for the first bank address BANK_ADDR00, which corresponds to the first bank array 280a, as an intermediate signal S based on each CID "CID[1:0]".

An inverter 236 may output (or be configured to output) a refresh bank address RBA by performing an XOR operation on the intermediate signal S and the first bank address BANK_ADDR00, output from the address register 220.

For example, a setting value BANK_ADDR00_00 for the first CID "CID00" and a setting value BANK_ADDR00_10 for the third CID "CID10" may be logic low, and a setting value BANK_ADDR00_01 for the second CID "CID01" and a setting value BANK_ADDR00_11 for the fourth CID "CID11" may be logic high. That is, the first bank address BANK_ADDR00, which corresponds to the first bank array 280a of each of the first through fourth memory dies 200a through 200d, may be set to be inverted for the first bank arrays 280a of the second and fourth memory dies 200b and 200d. Thus, the first and third memory dies 200a and 200c may receive the first bank address BANK_ADDR00 as a refresh bank address RBA00, and the second and fourth memory dies 200b and 200d may receive an inverted first bank address, which is obtained by inverting the first bank address BANK_ADDR00, as a refresh bank address RBA11. That is, the first and third memory dies 200a and 200c may receive a different refresh bank address from the second and fourth memory dies 200b and 200d.

The first and third memory dies 200a and 200c may perform (or be configured to perform) a refresh operation on their first bank arrays 280a corresponding to the refresh bank address RBA00, and the second and fourth memory dies 200b and 200d may perform (or be configured to perform) a refresh operation on their fourth bank arrays 280d corresponding to the refresh bank address RBA11. The first and third memory dies 200a and 200c may perform (or be configured to perform) on a refresh operation on memory cell rows of their first bank arrays 280a that correspond to the second target row address REF_ADDR01, and the second and fourth memory dies 200b and 200d may perform (or be configured to perform) a refresh operation on memory cell rows of their fourth bank arrays 280d that correspond to the second target row address REF_ADDR01.

The first bank array 280a of the first memory die 200a where a refresh operation is performed may not overlap with the fourth bank array 280d of the second memory die 200b where a refresh operation is performed, and the first bank array 280a of the third memory 200c where a refresh operation is performed may not overlap with the fourth bank array 280d of the fourth memory die 200d where a refresh operation is performed. That is, the bank arrays of a pair of adjacent memory dies where a refresh operation is performed may not overlap with each other.

For example, the first bank array 280a of the first memory die 200a that corresponds to the refresh bank address RBA00 may overlap with the first bank array 280a of the third memory die 200c that corresponds to the refresh bank address RBA11, and the fourth bank array 280d of the second memory die 200b that corresponds to the refresh bank address RBA00 may overlap with the fourth bank array 280d of the fourth memory die 200d that corresponds to the refresh bank address RBA11.

The memory device 20 may control a plurality of bank addresses BANK_ADDR for each of the first through fourth memory dies 200a through 200d. The memory device 20 may determine whether to invert the bank addresses BANK_ADDR and may generate (or be configured to generate) refresh bank addresses RBA by inverting or not inverting the bank addresses BANK_ADDR. The memory device 20 can generate (or be configured to generate) the refresh bank addresses RBA for the bank addresses BANK_ADDR such that power noise and heat can be properly distributed.

Figure 14:
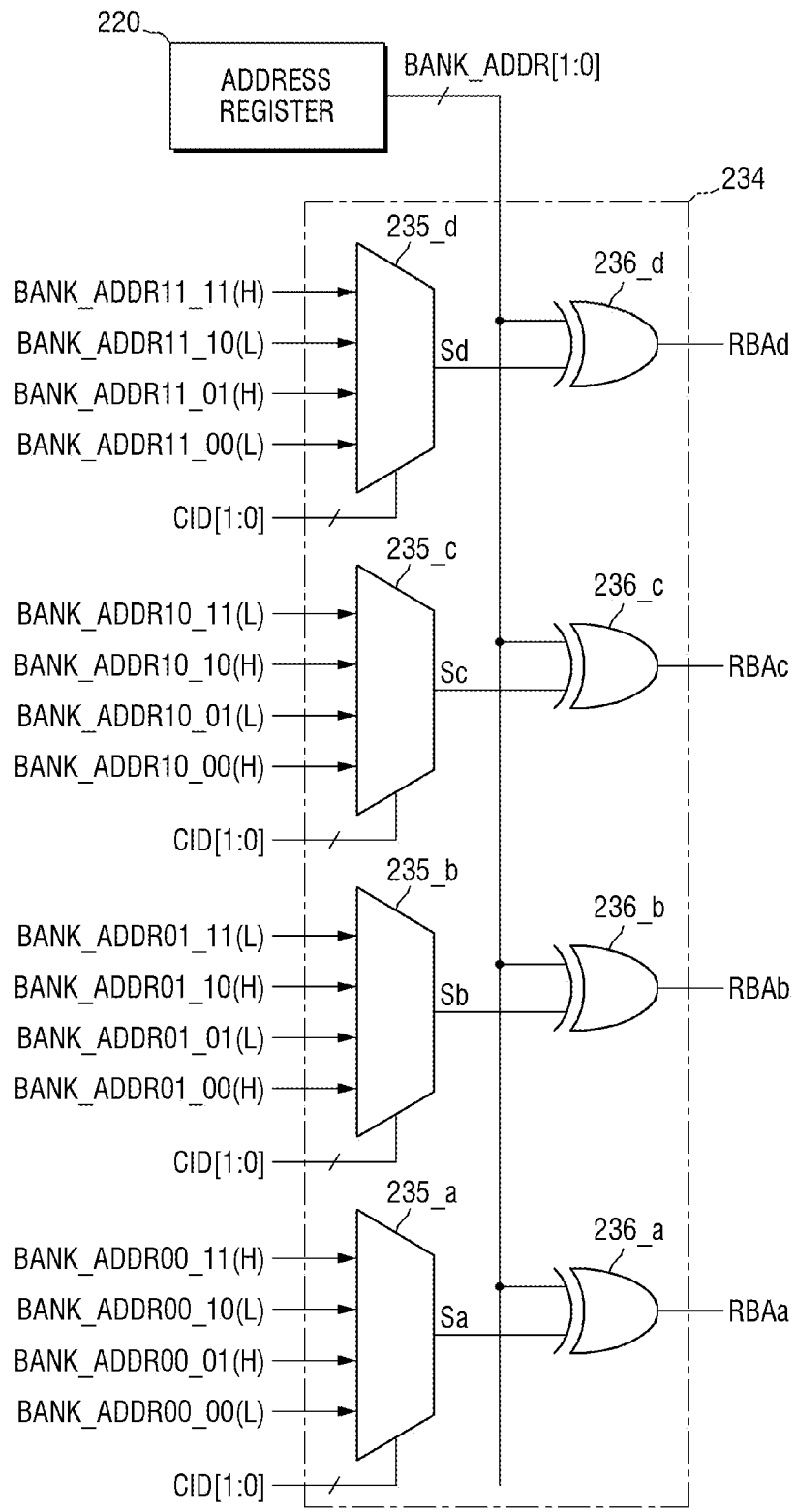
FIGS. 14 and 15 are block diagrams for explaining the operation of a memory device according to some example embodiments of the present disclosure.
Figure 15:
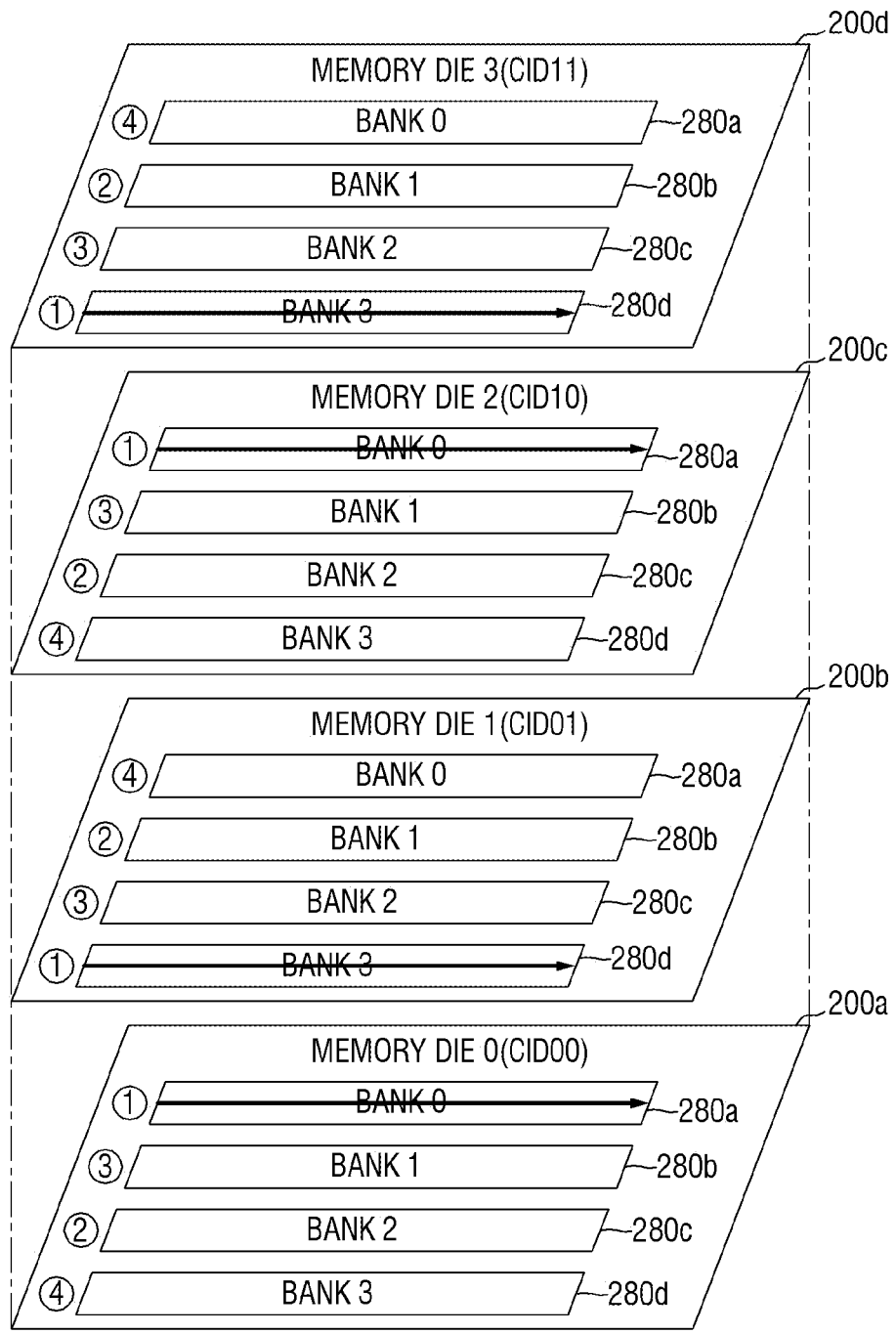

FIGS. 14 and 15 are block diagrams for explaining the operation of a memory device according to some example embodiments of the present disclosure.

Referring to FIGS. 14 and 15, a memory device 20 may include first through fourth memory dies 200a through 200d. The first through fourth memory dies 200a through 200d may have first through fourth CIDs "CID00", "CID01", "CID10", and "CID11", respectively. Each of the first through fourth memory dies 200a through 200d may include first through fourth bank arrays 280a through 280d. First through fourth bank addresses BANK_ADDR00 through BANK_ADDR11 may correspond to the first through fourth bank arrays 280a through 280d, respectively.

Each of the first through fourth memory dies 200a through 200d may receive, for example, a per-bank refresh command giving instructions to refresh each of the first through fourth bank arrays 280a through 280d, and may perform (or be configured to perform) a refresh operation.

In a case where an address register 220 outputs the first bank address BANK_ADDR00, which corresponds to the first bank arrays 280a of the first through fourth memory dies 200a through 200d, a bank address generator 234 (including multiplexers 235_a-235_d and inverters 236_a-236_d) may output (or be configured to output) the first bank address BANK_ADDR00 as a refresh bank address RBA00 for the first and third CIDs "CID00" and "CID10" and may output (or be configured to output) an inverted first bank address, which is obtained by inverting the first bank address BANK_ADDR00, as a refresh bank address RBA11 for the second and fourth CIDs "CID01" and "CID11". Thus, the first and third memory dies 200a and 200c may perform (or be configured to perform) a refresh operation on their first bank arrays 280a corresponding to the refresh bank address RBA00, and at the same time, the second and fourth memory dies 200b and 200d may perform (or be configured to perform) a refresh operation on their fourth bank arrays 280d corresponding to the refresh bank address RBA11 (①).

In a case where the address register 220 outputs the second bank address BANK_ADDR01, which corresponds to the second bank arrays 280b of the first through fourth memory dies 200a through 200d, the second and fourth memory dies 200b and 200d may perform (or be configured to perform) a refresh operation on their second bank arrays 280b corresponding to the refresh bank address RBA01, and at the same time, the first and third memory dies 200a and 200c may perform (or be configured to perform) a refresh operation on their third bank arrays 280c corresponding to the refresh bank address RBA10 (②).

In a case where the address register 220 outputs the third bank address BANK_ADDR10, which corresponds to the third bank arrays 280c of the first through fourth memory dies 200a through 200d, the second and fourth memory dies 200b and 200d may perform (or be configured to perform) a refresh operation on their third bank arrays 280c corresponding to the refresh bank address RBA10, and at the same time, the first and third memory dies 200a and 200c may perform (or be configured to perform) a refresh operation on their second bank arrays 280b corresponding to the refresh bank address RBA01 (③).

In a case where the address register 220 outputs the fourth bank address BANK_ADDR11, which corresponds to the fourth bank arrays 280d of the first through fourth memory dies 200a through 200d, the first and third memory dies 200a and 200c may perform (or be configured to perform) a refresh operation on their fourth bank arrays 280d corresponding to the refresh bank address RBA11, and at the same time, the second and fourth memory dies 200b and 200d may perform (or be configured to perform) a refresh operation on their first bank arrays 280a corresponding to the refresh bank address RBA00 (④).

Figure 16:
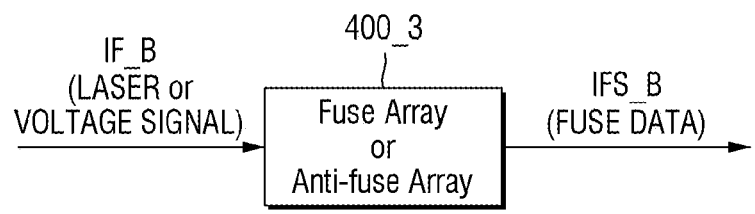
FIG. 16 is a block diagram of an example storing circuit of FIG. 9.

FIG. 16 is a block diagram of an example storing circuit of FIG. 9.

Referring to FIG. 16, a storing circuit 400_3 may be implemented as a fuse or an anti-fuse array. The fuse array or the anti-fuse array may include an array of a plurality of fuses or an array of a plurality of anti-fuses.

For example, in a case where the fuses or the anti-fuses are programmed by external laser equipment, setting values IFS_B may be stored in a nonvolatile manner by the fuses or the anti-fuses.

In another example, in a case where the fuses or the anti-fuses are programmed by an electric signal (e.g., a high-voltage signal), the setting values IFS_B may be stored in a volatile manner by input from the manufacturer of the memory device 20 or may be stored in a nonvolatile manner by input from a user after the release of the memory device 20.

Figure 17:
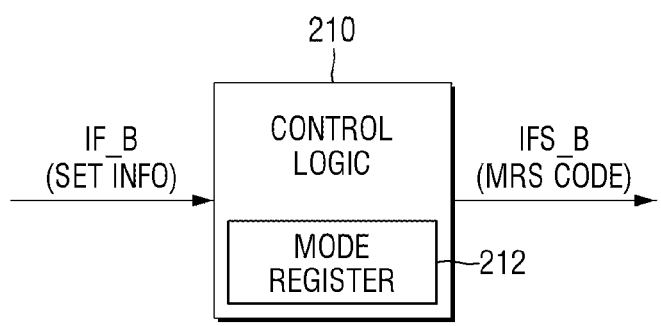
FIG. 17 is a block diagram of another example storing circuit of FIG. 9.

FIG. 17 is a block diagram of another example storing circuit of FIG. 9.

Referring to FIG. 17, a storing circuit 400_4 may be implemented as a mode register 212. Setting values IFS_B may be stored in the mode register 212 in accordance with (or based on) setting information IF_B input from the user. During an initial operation of the memory device 20, the setting values IFS_B may be provided to a bank address generator 234 as MRS codes. Alternatively, in response to the receipt of a command for setting the mode register 212 from the memory controller 10, the setting values IFS_B may be stored in the mode register 212. For example, the setting values IFS_B may be stored in the mode register 212 in response to the receipt of a DDR4 MRS command or a DDR5 MRW command.

Figure 18:
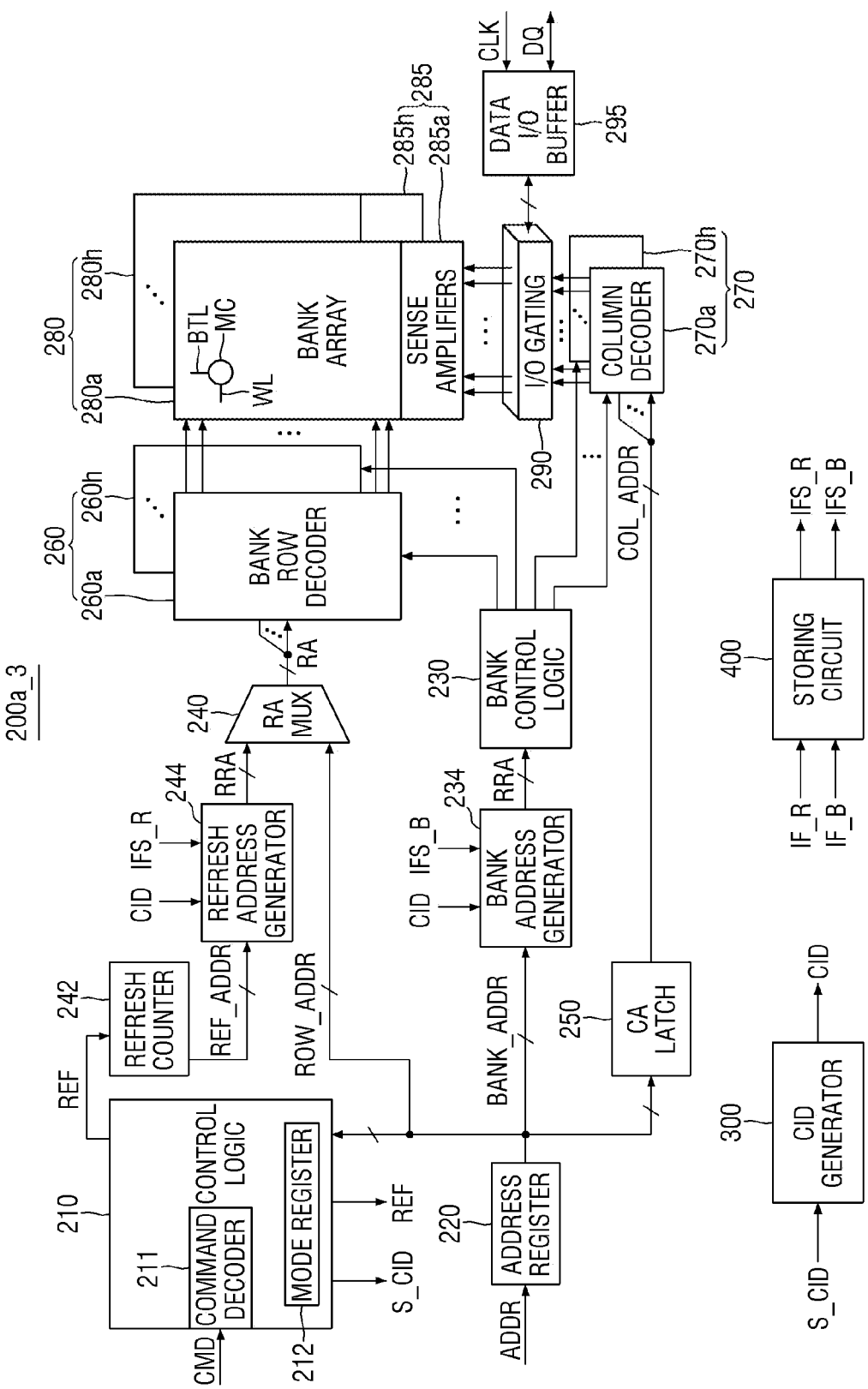
FIG. 18 is a block diagram of a memory die according to some example embodiments of the present disclosure.
Figure 19:
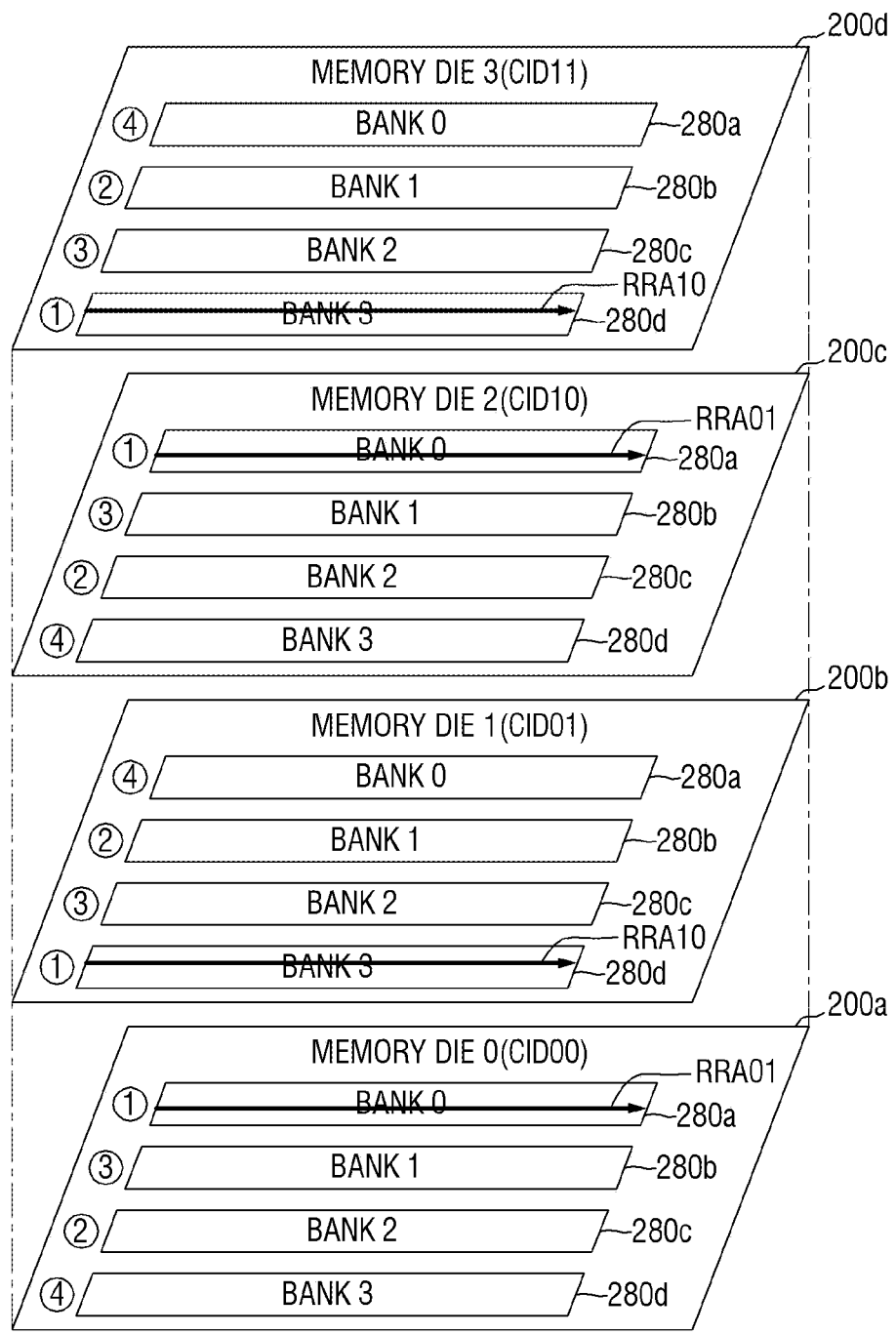
FIG. 19 is a block diagram for explaining the operation of a memory device according to some example embodiments of the present disclosure.

FIG. 18 is a block diagram of a memory die according to some example embodiments of the present disclosure. FIG. 19 is a block diagram for explaining the operation of a memory device according to some example embodiments of the present disclosure. The embodiment of FIGS. 18 and 19 will hereinafter be described, focusing mainly on the embodiment of FIG. 2.

Referring to FIG. 18, a memory die 200a_3 may include a refresh address generator 244 and a bank address generator 234. The refresh address generator 244 may correspond to its counterpart of FIG. 2, and the bank address generator 234 may correspond to its counterpart of FIG. 9.

In response to a refresh command being received from the memory controller 10, a control logic 210 may generate (or be configured to generate) a control signal REF and may provide the control signal REF to a refresh counter 242 or a selection circuit (see "225" of FIG. 10). The refresh command may be, for example, a per-bank refresh command giving instructions to refresh each of a plurality of bank arrays (280a through 280h).

In a case where a memory device 20 receives a refresh command, the refresh address generator 244 may output (or be configured to output) either target row addresses REF_ADDR or inverted target row addresses, which are obtained by inverting the target row addresses REF_ADDR, as row addresses RRA, and the bank address generator 234 may output (or be configured to output) either bank addresses BANK_ADDR and inverted bank addresses, which are obtained by inverting the bank addresses BANK_ADDR, as refresh bank addresses RBA. That is, the memory die 200a_3 may control the refresh row addresses RRA and the refresh bank addresses RBA.

For example, it is assumed that setting values IFS_R of FIG. 18 are the same as the setting values of FIG. 5, that setting values IFS_B of FIG. 18 are the same as the setting values of FIG. 14, that first through fourth memory dies 200a through 200d are performing a per-bank refresh operation on their first bank arrays 280a in response to the receipt of a refresh command, and that a refresh counter 242 outputs a second target row address REF_ADDR01 corresponding to second memory cell rows of the first through fourth memory dies 200a through 200d.

Referring to FIG. 19, the first memory die 200a may perform (or be configured to perform) a refresh operation on a memory cell row of its first bank array 280a that corresponds to a refresh row address RRA01. Simultaneously, the second memory die 200b may perform (or be configured to perform) a refresh operation on a memory cell row of its fourth bank array 280d that corresponds to a refresh row address RRA10, the third memory die 200c may perform (or be configured to perform) a refresh operation on a memory cell row of its first bank array 280a that corresponds to the refresh row address RRA01, and the fourth memory die 200d may perform (or be configured to perform) a refresh operation on a memory cell row of its fourth bank array 280d that corresponds to the refresh row address RRA10.

That is, during a per-bank refresh operation, the memory device 20 can control not only the first through fourth bank arrays 280a through 280d of the first through fourth memory dies 200a through 200d, but also memory cell rows of each of the first through fourth bank arrays 280a through 280d of the first through fourth memory dies 200a through 200d, to not overlap with one another.

Referring again to FIG. 18, a storing circuit 400 may store (or be configured to store) setting values IFS_R for target row addresses REF_ADDR for each CID and setting values IFS_B for bank addresses BANK_ADDR for each CID. The storing circuit 400 may correspond to its counterpart of any one of FIGS. 7, 8, 16, and 17.

Figure 20:
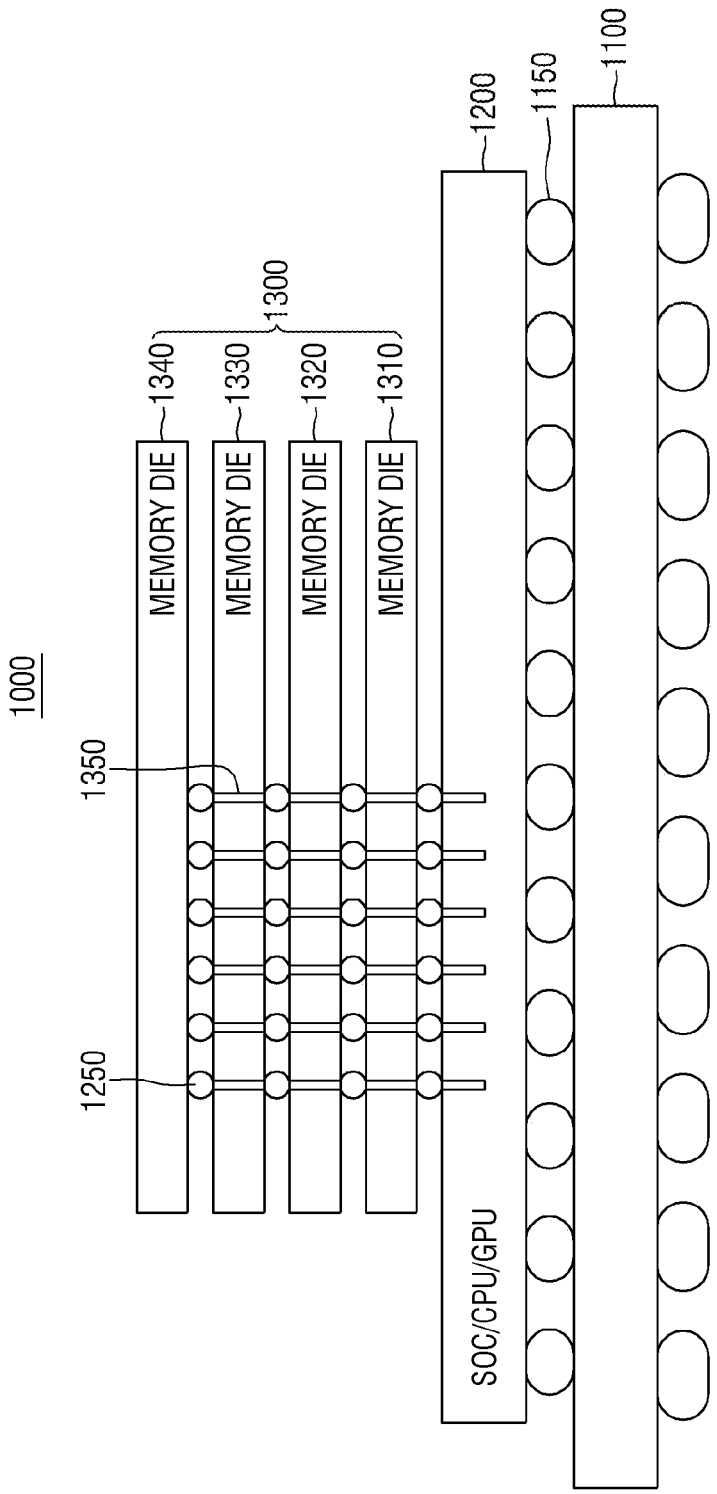
FIG. 20 is a block diagram of a semiconductor device according to some example embodiments of the present disclosure.

FIG. 20 is a block diagram of a semiconductor device according to some example embodiments of the present disclosure.

Referring to FIG. 20, a semiconductor device 1000 may be applicable to a three-dimensional (3D) chip structure. The semiconductor device 1000 may include a package substrate 1100, a system-on-chip (SoC) 1200, and a memory device 1300.

The SoC 1200 may be disposed on the package substrate 1100. The SoC 1200 may be connected to the package substrate 1100 via flip-chip bumps 1150.

The SoC 1200 may include a processor capable of performing various operations for a variety of applications supported by the semiconductor device 1000. For example, the SoC 1200 may include at least one of a central processing unit (CPU), an image signal processor (ISP), a digital signal processor (DSP), a graphics processing unit (GPU), a vision processing unit (VPU), and a neural processing unit (NPU). The SoC 1200 may include a physical layer electrically connected to a buffer die (not illustrated). The SoC 1200 may store (or be configured to store) data necessary for each operation in the memory device 1300 or may read (or be configured to read) data necessary for each operation from the memory device 1300. The SoC 1200 may include the memory controller 10 of FIG. 1.

The memory device 1300 may include a plurality of memory dies 1310, 1320, 1330, and 1340 that are stacked. The memory dies 1310, 1320, 1330, and 1340 may form a high-bandwidth memory (HBM) structure. To realize the HBM structure, TSVs 1350 are formed in the memory dies 1310, 1320, 1330, and 1340. The TSVs 1350 may be electrically connected to micro-bumps 1250, which are formed between the memory dies 1310, 1320, 1330, and 1340. The memory dies 1310, 1320, 1330, and 1340 may correspond to the memory dies 200a through 200n of FIG. 2.

Although not specifically illustrated, a buffer die or a logic die may be disposed between the memory die 1310 and the SoC 1200. The buffer die may correspond to the buffer die 100 of FIG. 2.

Figure 21:
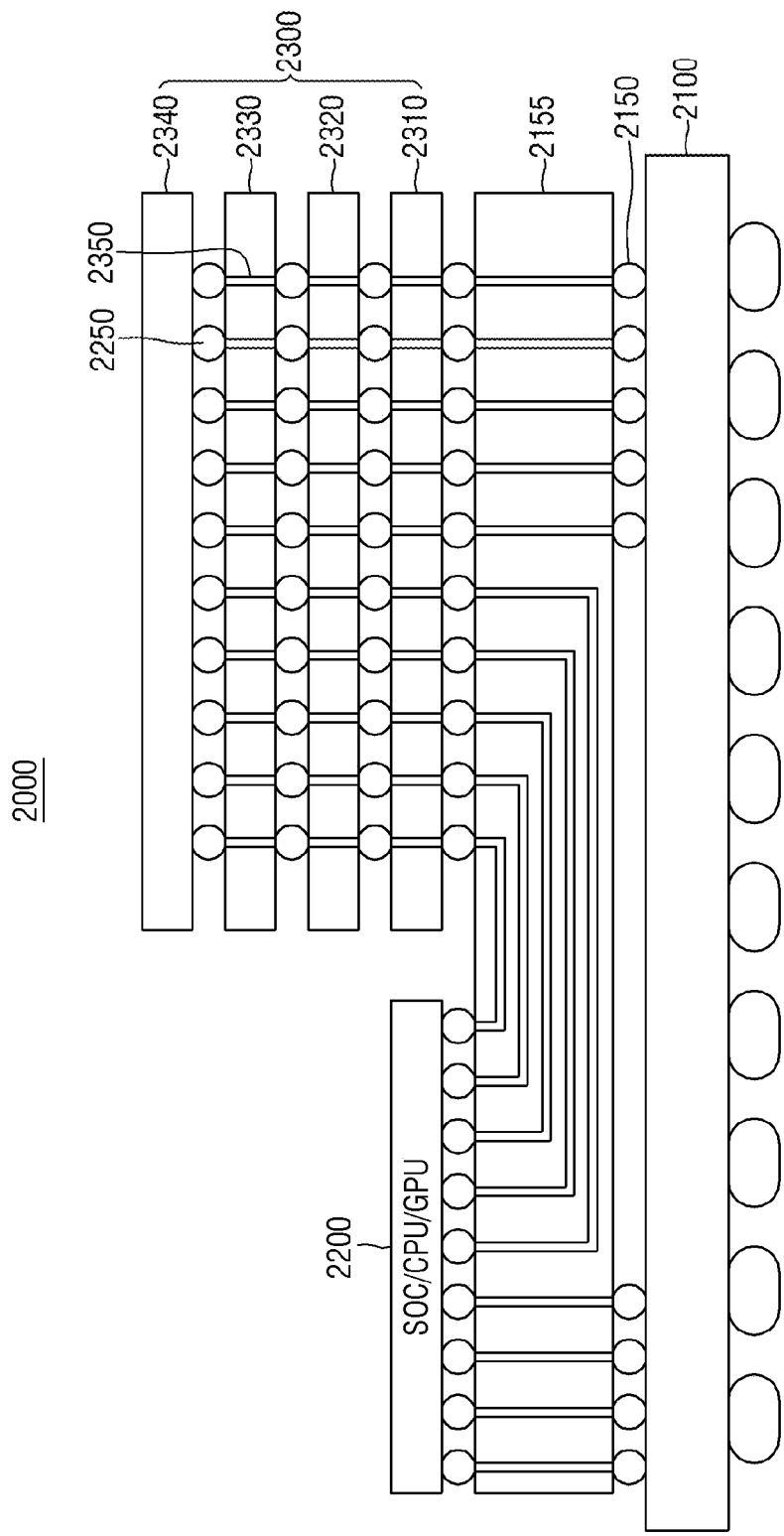
FIG. 21 is a block diagram of a semiconductor device according to some example embodiments of the present disclosure.

FIG. 21 is a block diagram of a semiconductor device according to some example embodiments of the present disclosure.

Referring to FIG. 21, a semiconductor device 2000 may be applicable to a 2.5-dimensional (2.5D) chip structure. The semiconductor device 2000 may include a package substrate 2100, an interposer 2155, a SoC 2200, and a memory device 2300. The package substrate 2100, the SoC 2200, micro-bumps 2250, the memory device 2300, and TSVs 2350 of FIG. 21 may correspond to the package substrate 1100, the SoC 1200, the micro-bumps 1250, the memory device 1300, and the TSVs 1350, respectively, of FIG. 20.

The interposer 2155 may be disposed on the package substrate 2100. The interposer 2155 may be connected to the package substrate 2100 via flip-chip bumps 2150. The interposer 2155 may connect the memory device 2300 and the SoC 2200 with wires. The memory device 2300 and the SoC 2200 may be connected to the interposer 2155 via the micro-bumps 2250.

Additionally, the semiconductor device 1 and/or the components included therein may include and/or be included in processing circuitry such as hardware including logic circuits; a hardware/software combination such as a processor executing software; or a combination thereof. For example, the processing circuitry may include, but is not limited to, a central processing unit (CPU), a memory controller, an arithmetic logic unit (ALU), a digital signal processor, a microcomputer, a field programmable gate array (FPGA), and programmable logic unit, a microprocessor, application-specific integrated circuit (ASIC), etc.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. A memory device comprising:
a plurality of memory chips that are stacked,
wherein each of the memory chips includes
a memory cell array, which includes a plurality of memory cell rows;
a chip identifier generator configured to generate a chip identifier signal indicating a chip identifier of each of the memory chips;
a refresh counter configured to generate a target row address for refreshing a memory cell row from among the plurality of memory cell rows in response to a refresh command; and
a refresh address generator configured to receive the chip identifier signal and the target row address, and output one of the target row address and an inverted target row address as a refresh row address targeted for a refresh operation based on the chip identifier signal, wherein the refresh operation is performed on a memory cell row corresponding to the refresh row address, and wherein the inverted target row address is obtained by inverting the target row address.

2. The memory device of claim 1, wherein the refresh address generator includes
a multiplexer configured to output one of a plurality of setting values that correspond to the memory cell rows included in a corresponding memory chip from among the plurality of memory chips as an intermediate signal, and an inverter configured to output one of the target row address and the inverted target row address as the refresh row address based on the intermediate signal.

3. The memory device of claim 2, wherein the inverter is configured to perform an XOR operation on the target row address and the intermediate signal.

4. The memory device of claim 1, wherein each of the memory chips further includes a storing circuit configured to store setting values for the target row address that correspond to the memory cell rows included in a corresponding memory chip from among the plurality of memory chips, and the refresh address generator is configured to receive the setting values from the storing circuit and output one of the target row address and the inverted target row address as the refresh row address based on the chip identifier signal and the setting values.

5. The memory device of claim 4, wherein the storing circuit includes at least one of a fuse circuit or at least one of an anti-fuse circuit.

6. The memory device of claim 4, wherein each of the memory chips further includes control logic which includes a mode register configured to store values for controlling an operation of the corresponding memory chip, and the mode register includes the storing circuit.

7. The memory device of claim 6, wherein the control logic is configured to store the setting values in the mode register in response to a mode register set command for setting the mode register.

8. The memory device of claim 1, wherein the memory cell array includes a plurality of bank arrays which include the memory cell rows, and each of the memory chips further includes a bank address generator configured to output one of a bank address and an inverted bank address as a refresh bank address in response to the refresh command and the bank address, and perform the refresh operation on a bank array from among the plurality of bank arrays based on the refresh bank address and a memory cell row from among the plurality of memory cell rows corresponding to the refresh row address, wherein the inverted bank address is obtained by inverting the bank address.

9. The memory device of claim 8, wherein the bank address generator includes a multiplexer configured to output one of a plurality of setting values corresponding to the plurality of bank arrays included in each of the memory chips as an intermediate signal, and an inverter configured to output one of the bank address and the inverted bank address as the refresh bank address based on the intermediate signal.

10. The memory device of claim 8, wherein the refresh command is a per-bank refresh command giving instructions to refresh each of the bank arrays.

11. A memory device comprising:

a plurality of memory chips including a first memory chip and a second memory chip, the first memory chip including a first plurality of memory cell rows and the second memory chip including a second plurality of memory cell rows, wherein the first memory chip is configured to perform a refresh operation on a first memory cell row of the first plurality of memory cell rows corresponding to a first refresh row address in response to a refresh command, and the second memory chip is configured to perform the refresh operation on a second memory cell row of the second plurality of memory cell rows corresponding to a second refresh row address, which is different from the first refresh row address, in response to the refresh command, while the first memory chip is performing the refresh operation on the first memory cell row.

12. The memory device of claim 11, wherein the second memory chip is on the first memory chip, and the second memory cell row does not overlap with the first memory cell row.

13. The memory device of claim 12, wherein the first and second memory chips are closest to each other from among the plurality of memory chips with no intervening memory chip therebetween.

14. The memory device of claim 11, wherein the first memory cell row is a k-th memory cell row from an uppermost memory cell row of the first memory chip, where k is a natural number, and the second memory cell row is the k-th memory cell row from a lowermost memory cell row of the second memory chip.

15. The memory device of claim 11, wherein the first memory chip includes a first plurality of bank arrays including the first plurality of memory cell rows, the second memory chip further includes a second plurality of bank arrays including the second plurality of memory cell rows, the first memory cell row is included in a first bank array among the first plurality of bank arrays of the first memory chip, the second memory cell row is included in a second bank array among the second plurality of bank arrays of the second memory chip, the second memory chip is on the first memory chip, and the second bank array overlaps with the first bank array.

16. The memory device of claim 11, wherein the first memory chip includes a first plurality of bank arrays including the first plurality of memory cell rows, and the second memory chip further includes a second plurality of bank arrays including the second plurality of memory cell rows, the first memory cell row is included in a first bank array among the first plurality of bank arrays of the first memory chip, the second memory cell row is included in a second bank array among the second plurality of bank arrays of the second memory chip, the second memory chip is on the first memory chip, and the second bank array does not overlap with the first bank array.

17. The memory device of claim 11, further comprising:

a third memory chip including a third plurality of memory cell rows, and a fourth memory chip including a fourth plurality of memory cell rows, wherein the third memory chip is configured to perform the refresh operation on a third memory cell row of the third plurality of memory cell rows corresponding to a third refresh row address in response to the refresh command while the first memory chip is performing the refresh operation on a first memory cell row of the first memory chip, and the fourth memory chip is configured to perform the refresh operation on a fourth memory cell row of the fourth plurality of memory cell rows corresponding to a fourth refresh row address, which is different from the third refresh row address, in response to the refresh command while the first memory chip is performing the refresh operation on the first memory cell row of the first memory chip.

18. The memory device of claim 17, wherein
the first memory chip, the second memory chip, the third memory chip, and the fourth memory chip are sequentially stacked,
the second memory cell row overlaps with the fourth memory cell row, and
the first memory cell row overlaps with the third memory cell row.

19. The memory device of claim 11, wherein
the first memory chip includes a first bank array and a second bank array, the first bank array including a first portion of the first plurality of memory cell rows, the second bank array including a second portion of the first plurality of memory cell rows, and
a first location of a memory cell row of the first portion of the first plurality of memory cell rows of the first bank array differs from a second location of a memory cell row of the second portion of the first plurality of memory cell rows of the second bank array.

20. A semiconductor device comprising:
a memory controller configured to provide a mode register set command and a refresh command; and
a memory device including a plurality of memory chips that are stacked, each of the memory chips including a plurality of memory cell rows and a refresh counter configured to generate a target row address for refreshing a memory cell row of the plurality of memory cell rows in response to the refresh command,
wherein
the mode register set command includes a setting value for converting the target row address into a refresh row address by one of inverting and not inverting the target row address, during a refresh operation performed in response to the refresh command, and
each of the memory chips is configured to store the setting value in a mode register in response to the mode register set command and perform the refresh operation on a memory cell row corresponding to one of the target row address and the inverted target row address in response to the refresh command, and
wherein the inverted target row address is obtained by inverting the target row address in a refresh address generator of the memory device based on the setting value.

* * * * *